(12) United States Patent
Moreno et al.

(10) Patent No.: US 9,167,709 B2
(45) Date of Patent: Oct. 20, 2015

(54) ELECTRONIC MODULE FOR VEHICLE

(75) Inventors: Jean-Yves Moreno, Meru (FR); Valery Govindassamy, Taverny (FR); Benedicte Silvestre, Vaux sur Seine (FR)

(73) Assignee: Valeo Systemes de Controle Moteur, Cergy Saint Christophe (FR)

( * ) Notice: Subject to any disclaimer, the term of this patent is extended or adjusted under 35 U.S.C. 154(b) by 56 days.

(21) Appl. No.: 13/239,557

(22) Filed: Sep. 22, 2011

(65) Prior Publication Data

US 2012/0075811 A1     Mar. 29, 2012

(30) Foreign Application Priority Data

Sep. 23, 2010   (FR) ...................................... 10 57648

(51) Int. Cl.
*H05K 1/14*        (2006.01)
*H05K 5/06*        (2006.01)

(52) U.S. Cl.
CPC ...................................... *H05K 5/064* (2013.01)

(58) Field of Classification Search
CPC ........... H01L 2224/48247; H01L 2224/73265; H01L 2224/85205; H05K 7/02; H05K 2203/049; H05K 5/064; B23K 20/004; B23K 2201/40
USPC ...................... 361/600, 679.01, 728, 736, 739
See application file for complete search history.

(56) References Cited

U.S. PATENT DOCUMENTS 7,838,101 B2 * 11/2010 Delsman et al. ............... 428/172
2013/0094165 A1 * 4/2013 Yano et al. ..................... 361/784

FOREIGN PATENT DOCUMENTS

EP        2 120 263 A1   11/2009
JP        2003 318568 A  11/2003
JP        2009130230 A    6/2009

OTHER PUBLICATIONS

French Search Report issued in the corresponding French application No. 1057648, mailing date May 11, 2011 (2 pages).

\* cited by examiner

*Primary Examiner* — Bernard Rojas
(74) *Attorney, Agent, or Firm* — Osha Liang LLP

(57) ABSTRACT

An electronic module (10) designed to be installed in a vehicle, comprises a casing (11) containing at least two circuit boards (12, 13) connected together by at least one electrical conductor (14), the conductor having one of its ends bonded to one of the circuit boards and the other of its ends bonded to the other circuit board, the ends of the conductor being bonded by a "wedge bonding" technique, the casing also containing a protective resin (17) coating at least one of the bonded ends of the electrical conductor. This resin is a polyurethane resin.

13 Claims, 1 Drawing Sheet

ELECTRONIC MODULE FOR VEHICLE

TECHNICAL FIELD

The invention relates to an electronic module designed to be installed in a vehicle, in particular in a motor vehicle. It relates to any assembly of circuit boards or PCBs (for "Printed Circuit Board") installed on a metal or plastic casing (power electronics, control electronics), in a mechatronic environment, on-board electronics. Although a particular application is that of the motor vehicle, the invention may apply to fields having usage requirements that are close or similar.

DESCRIPTION OF THE PRIOR ART

Currently, the electronic modules installed in a motor vehicle are subjected to thermal shocks and to vibrations depending on the respective specifications of each manufacturer. In order to comply with the quality requirements of each manufacturer, the fitted circuit boards (power and control) are fixed in casings, their interconnections being provided by various technologies, notably the technology called "wedge bonding".

The "wedge bonding" technique is defined as follows. A wire, most frequently made of aluminium, is inserted by a tool (called a stylet or needle), it is applied to the pad to be bonded. The connection between the wire and the zone to be connected is made by combining pressure and ultrasound vibration. It involves a bonding called "cold" bonding. It is the ultrasound energy that softens the wire, similar to the effect obtained by a rise in temperature. The wire is then guided by the tool onto the second pad and the bonding is carried out. The wires may have diameters of between 75 μm and 650 μm.

In order to protect these bonds against oxidation, thermal shocks, vibrations and damp heat, use is made of epoxy-based or acrylic-based resins or of silicone gels. The resins are deposited locally with the aid of distributors. They are polymerized either in the oven, or by UV. The silicone gels are poured into retention zones in which the connecting wires are bonded.

The epoxy or acrylic resins, and the silicone gels, have good thermal, electrical and mechanical insulation performance. However, their use for the on-board electronic modules causes a cost of these modules that is considered excessive by the motor-vehicle manufacturers in particular.

SUMMARY OF THE INVENTION

In order to remedy the cost problem explained above, it is proposed to replace the protective material of the circuit boards placed in a casing (epoxy resin, acrylic resin, silicone gels) with a polyurethane resin. The polyurethane resin has equivalent thermal, electrical and mechanical insulation performances to those of the materials of the prior art (epoxy resin, acrylic resin, silicone gel), but the economic saving resulting from the material and from its application is very great.

Through its mechanical properties and its thermal expansion ($220.10^{-6}$ m/° C.), the invention advantageously applies to aluminium wires with a diameter of greater than or equal to 250 μm and to aluminium ribbons.

The subject of the invention is therefore an electronic module designed to be installed in a vehicle, the module comprising a casing containing at least two circuit boards connected together by at least one electrical conductor, the conductor having one of its ends bonded to one of the circuit boards and the other of its ends bonded to the other circuit board, the ends of the conductor being bonded by the "wedge bonding" technique, the casing also containing a protective resin coating at least one of the bonded ends of the electrical conductor, characterized in that the protective resin is a polyurethane resin.

One of the two circuit boards may be a power board, the other circuit board may be a control board.

According to a first embodiment, the protective resin completely coats the circuit boards.

According to a second embodiment, the protective resin coats only the power circuit board. In this case, the control board can rest on the coating resin.

The electrical conductor may be an aluminium wire with a diameter of more than 250 μm. It may also be an aluminium ribbon.

The casing may advantageously be made of aluminium.

BRIEF DESCRIPTION OF THE DRAWINGS

The invention will be better understood and other advantages and particular features will appear on reading the following description given as a non-limiting example, accompanied by the appended drawings amongst which.

DETAILED DESCRIPTION OF PARTICULAR EMBODIMENTS

Figure 1:
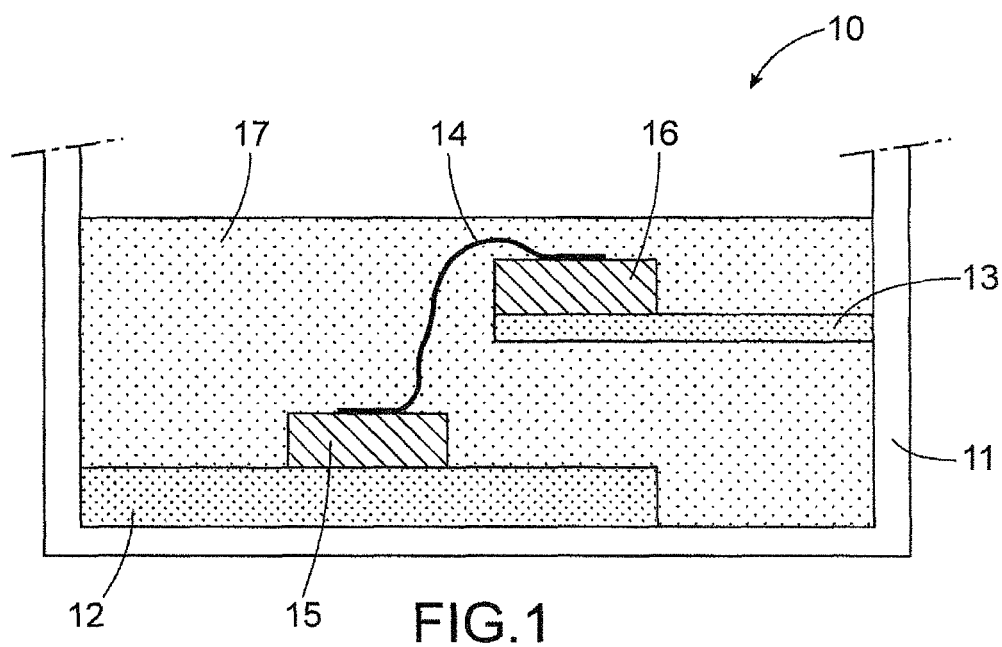
FIG. 1 represents a first embodiment of the invention for an electronic module comprising a power circuit board and a control circuit board.

FIG. 1 represents an electronic module 10 designed to be installed, as an example, in a motor vehicle. The module comprises a casing 11, for example made of aluminium, which contains two circuit boards 12 and 13. The circuit boards 12 and 13 (or PCBs for "Printing Circuit Boards") are attached to the casing 11 by attachment means not shown (spacers, threaded rods and nuts for example).

The circuit board 12 is for example a power board and the circuit board 13 is a control board. For the purposes of simplification, only one electrical conductor 14 has been shown in FIG. 1 for connection between the two circuit boards 12 and 13, but there may be several of them. Similarly, the module 10 may contain more than two circuit boards, each board being able to be connected to another board by one or more electrical conductors.

The electrical conductor 14 electrically connects an electrically conductive pad 15 of the circuit board 12 to an electrically conductive pad 16 of the circuit board 13. The ends of the electrical conductor 14 are bonded to the pads 15 and 16 using the "wedge bonding" technique. Thus, one or more electronic components of the circuit board 12 is or are connected to one or more electronic components of the circuit board 13.

As shown in FIG. 1, a coating resin 17 has been poured and polymerized in the casing 11 so as to coat the two circuit boards. Thus, the bonded ends of the electrical conductor 14 are protected from oxidation, from thermal shocks, from vibrations and from damp heat.

FIG. 1 shows an embodiment of the invention in which the circuit boards are completely coated in resin, which has the effect of also protecting the components situated on the circuit boards and the boards themselves which are subjected in particular to vibration stresses.

The protective resin could also be distributed over only one of the bonded ends of the electrical conductor, or over the two ends of this electrical conductor.

Figure 2:
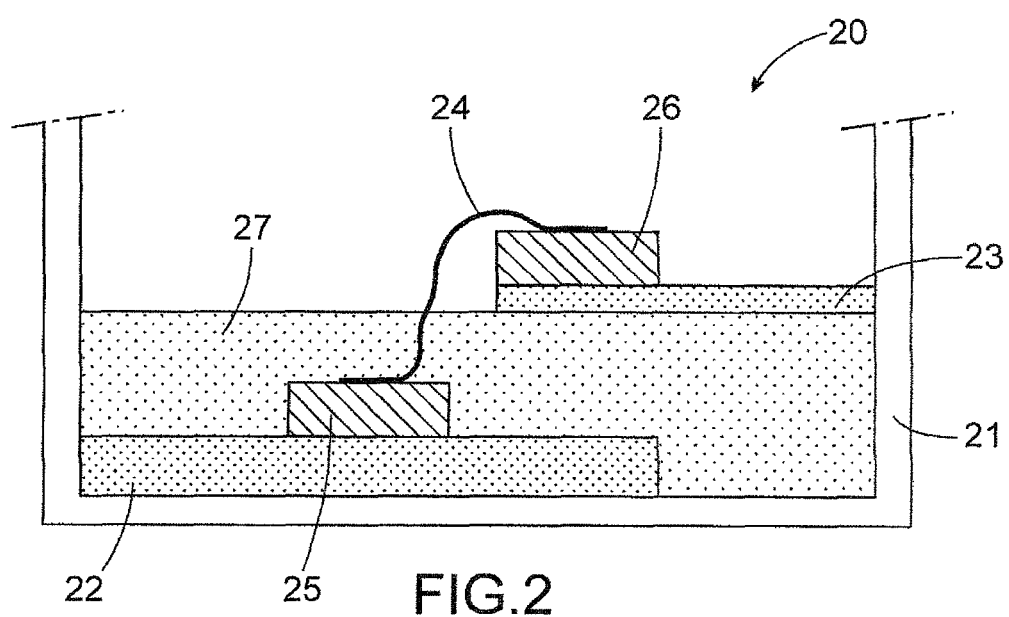
FIG. 2 represents a second embodiment of the invention for an electronic module comprising a power circuit board and a control circuit board.

FIG. 2 represents a second exemplary embodiment of the invention. In this example, the electronic module 20 comprises a casing 21 containing two circuit boards 22 and 23. As in the previous example, the circuit boards 22 and 23 are attached to the casing 21 by attachment means not shown. Also as above, the circuit board 22 is a power board and the circuit board 23 is a control board. The electrical conductor 24 electrically connects an electrically conductive pad 25 of the circuit board 22 to an electrically conductive pad 26 of the circuit board 23. The ends of the electrical conductor 24 are bonded to the pads 25 and 26 by the "wedge bonding" technique.

In the case of the module illustrated by FIG. 2, a coating resin 27 has been poured and polymerized in the casing 21 so as to coat only the circuit board 22.

The polyurethane resin used to embody the present invention may be a resin marketed by SEG Diélectriques and polymerizable at ambient temperature. It is thus possible to obtain electronic modules that are resistant to thermal shocks of between −40° C. and +125° C. and passing vibration tests for a vibration of more than 30 g.

Polyurethane resin allows the discharge of calories generated by power circuit boards at the rate of 0.4 W/m.° C. to the metal casing of the module.

The use of a polyurethane resin makes it possible to avoid using a polymerization oven. The electronic module illustrated in FIG. 1, in which the connecting electrical conductor is completely coated in resin, has the advantage of not requiring a resin-deposition robot and the assembly comprising a UV lamp and an optical fibre guide for the polymerization. The manufacturing cycle time is reduced.

The price of polyurethane resin is also advantageous. Thus, it is estimated, for the example illustrated by FIG. 1, that the implementation cost is reduced by 75% compared with an epoxy resin. Moreover, polyurethane resin promotes the discharge of calories.

The polyurethane resin is for example a material pertaining to the scale A of the Shore Durometer.

The invention also relates to a power module comprising at least a power component. The power module comprises a casing wherein the power component is mounted and containing polyurethane resin for protecting the component as described in the aforementioned electronic module. The power component is for example an electronic die. Preferably, the power component is electrically linked to an electrically conductive pad 15, 16, 25, 26 or to another power component through electrical conductors 14 bonded by the technique of <<wedge bonding>> as previously described. The electrical conductor 14 is bonded on a respective bonding pad of the component.

In an embodiment, the conductor 14 and the bonding pad of the component or the electrically conductive pad 15, 16, 25, 26 have features allowing a shape of the electrical conductor 14 that improves its maintain in the polyurethane resin, particularly its mechanical aspect. In particular, the electrical conductor 14 has a bend shape in the vicinity of the conductive pad 15, 16, 25, 26 or of the bonding pad.

For example, the conductor 14 is bonded at each end, and the horizontal distance between the two bondings is more than, or equal to, 6 mm. The vertical distance between the two bondings can be less than, or equal to, 10 mm; and the length of the conductor 14 can be less than, or equal to, a value 150×D, where D is the diameter of the conductor 14. Preferably, the conductor 14 has a diameter D comprised between 300 and 500 µm. These features improve the maintain of the conductor 14 in the polyurethane resin.

The invention claimed is:

1. An electronic module designed to be installed in a vehicle, the module comprising:
   a casing containing at least two circuit boards connected together by at least one electrical conductor, the conductor having one of its ends bonded to one of the circuit boards and the other of its ends bonded to the other circuit board, the ends of the conductor being bonded by a "wedge bonding" technique,
   wherein the casing also comprises a protective resin coating at least one of the bonded ends of the electrical conductor,
   wherein the protective resin is a polyurethane resin, and the conductor has a diameter comprised between 300 and 500 µm,
   wherein the polyurethane resin is a material pertaining to a scale A of a Shore Durometer, and
   wherein a length of the conductor is less than or equal to a value 150×D, where D is a diameter of the conductor.

2. The electronic module according to claim 1, in which one of the two circuit boards is a power board, and another of the two circuit boards is a control board.

3. The electronic module according to claim 2, in which the protective resin completely coats the circuit boards.

4. The electronic module according to claim 2, in which the protective resin coats only the power circuit board.

5. The electronic module according to claim 4, in which the control board rests on the coating resin.

6. The electronic module according to claim 1, in which the electrical conductor is an aluminum wire.

7. The electronic module according to claim 1, in which the electrical conductor is an aluminum ribbon.

8. The electronic module according to claim 1, in which the casing is made of aluminum.

9. An electronic module according to claim 1, wherein a vertical distance between the two bondings is less than or equal to 10 mm.

10. An electronic module according to claim 1, wherein a horizontal distance between the two bondings is more than or equal to 6 mm.

11. An electronic module according to claim 1, wherein the conductor has a bend shape in a vicinity of at least one of the bonded ends.

12. An electronic module designed to be installed in a vehicle, the module comprising:
   a casing containing at least two circuit boards connected together by at least one electrical conductor, the conductor having one of its ends bonded to one of the circuit boards and the other of its ends bonded to the other circuit board, the ends of the conductor being bonded by a "wedge bonding" technique,
   wherein the casing also comprises a protective resin coating at least one of the bonded ends of the electrical conductor, and
   wherein the protective resin is a polyurethane resin, a vertical distance between the two bondings is less than or equal to 10 mm, a horizontal distance between the two bondings is more than or equal to 6 mm, and the conductor has a diameter comprised between 300 and 500 µm, and
   wherein a length of the conductor is less than or equal to a value 150×D, where D is a diameter of the conductor.

13. An electronic module according to claim 12, wherein the conductor has a bend shape in a vicinity of at least one of the bonded ends.

* * * * *